US010516227B2

(12) United States Patent
Li

(10) Patent No.: US 10,516,227 B2
(45) Date of Patent: Dec. 24, 2019

(54) CONNECTOR AND COMMUNICATIONS DEVICE

(71) Applicant: HUAWEI TECHNOLOGIES CO., LTD., Shenzhen, Guangdong (CN)

(72) Inventor: Yutao Li, Shenzhen (CN)

(73) Assignee: HUAWEI TECHNOLOGIES CO., LTD., Shenzhen, Guangdong (CN)

(*) Notice: Subject to any disclaimer, the term of this patent is extended or adjusted under 35 U.S.C. 154(b) by 0 days.

(21) Appl. No.: 16/393,630

(22) Filed: Apr. 24, 2019

(65) Prior Publication Data
US 2019/0252811 A1 Aug. 15, 2019

Related U.S. Application Data

(63) Continuation of application No. PCT/CN2017/081548, filed on Apr. 22, 2017.

(30) Foreign Application Priority Data

Nov. 14, 2016 (CN) .......................... 2016 1 1029644

(51) Int. Cl.
H01R 12/00 (2006.01)
H01R 12/73 (2011.01)
(Continued)

(52) U.S. Cl.
CPC ........... *H01R 12/73* (2013.01); *H01R 12/721* (2013.01); *H01R 25/00* (2013.01)

(58) Field of Classification Search
CPC .... H01R 12/73; H01R 12/735; H01R 12/721; H01R 12/722; H01R 25/00
(Continued)

(56) References Cited

U.S. PATENT DOCUMENTS 6,634,909 B2 * 10/2003 Lin ...................... G11B 33/122
439/638
6,840,796 B2 * 1/2005 Marcinkiewicz .... H01R 12/592
439/495
(Continued)

FOREIGN PATENT DOCUMENTS

CN 101779334 A 7/2010
CN 201674666 U 12/2010
(Continued)

Primary Examiner — Khiem M Nguyen
(74) Attorney, Agent, or Firm — Womble Bond Dickinson (US) LLP

(57) ABSTRACT

A connector (100) and a communications device is disclosed. The connector includes a connector body (41) and three connecting ends disposed on the connector body. M signal interfaces (51a) inside a first connecting end (42) are in communication with M signal interfaces (51b) inside a second connecting end (43) in a one-to-one correspondence. The first connecting end is connected to a backplane connector (32) on a backplane (31). The second connecting end is connected to one end (45a) of a transmission cable (45), and the other end (45b) of the transmission cable is connected to a communications component (46) on a target board (33a). The backplane is configured to implement communication between X boards (33), and the target board is any one of X boards, where M≥1 and X≥1. A third connecting end (44) is configured to secure the connector body to the target board.

20 Claims, 4 Drawing Sheets

(51) Int. Cl.
 *H01R 12/72* (2011.01)
 *H01R 25/00* (2006.01)
(58) Field of Classification Search
 USPC ...................................... 439/59, 61–65, 502
 See application file for complete search history.

(56) References Cited

U.S. PATENT DOCUMENTS

| | | |
|---|---|---|
| 7,537,462 B2 | 5/2009 | Higuchi et al. |
| 7,833,065 B2 | 11/2010 | Lin et al. |
| 2002/0068481 A1 | 6/2002 | Flickinger et al. |
| 2009/0251867 A1 | 10/2009 | Sharma et al. |
| 2010/0081303 A1 | 4/2010 | Roth et al. |
| 2010/0197169 A1 | 8/2010 | Amleshi et al. |
| 2011/0302346 A1 | 12/2011 | Vahdat et al. |
| 2012/0058684 A1 | 3/2012 | De et al. |
| 2014/0242844 A1 | 8/2014 | Wanha et al. |
| 2018/0220545 A1 | 8/2018 | Zhang et al. |

FOREIGN PATENT DOCUMENTS

| | | |
|---|---|---|
| CN | 102307142 A | 1/2012 |
| CN | 202308628 U | 7/2012 |
| CN | 102906943 A | 1/2013 |
| CN | 202678544 U | 1/2013 |
| CN | 103545630 A | 1/2014 |
| CN | 104009307 A | 8/2014 |
| CN | 104064893 A | 9/2014 |
| CN | 105048198 A | 11/2015 |

\* cited by examiner

US 10,516,227 B2

CONNECTOR AND COMMUNICATIONS DEVICE

CROSS-REFERENCE TO RELATED APPLICATIONS

This application is a continuation of International Application No. PCT/CN2017/081548, filed on Apr. 22, 2017, which claims priority to Chinese Patent Application No. 201611029644.9, filed on Nov. 14, 2016. The disclosures of the aforementioned applications are hereby incorporated by reference in their entireties.

TECHNICAL FIELD

The present disclosure relates to the field of information technologies, and in particular, to a connector and a communications device.

BACKGROUND

A backplane is a core part of a frame-shaped communications device. The backplane and a plurality of boards are connected to each other, so that signal interconnection between different boards can be implemented. As shown in FIG. 1, for a conventional frame-shaped communications device, a board 11 is connected to a backplane 13 by using a backplane connector 12 (the backplane connector 12 includes a first backplane connector 12a disposed on the board 11 and a second backplane connector 12b disposed on the backplane 13). Components such as a chip 14 are disposed on the board 11. When needing to transmit an electrical signal to a component on another board, the chip 14 may be in communication with the backplane connector 12 by using a cabling 15 on the board 11, and then transmits the electrical signal to the backplane 13 by using the backplane connector 12. Finally, the backplane 13 transmits the electrical signal to the another board.

If a high speed cable (a transmission loss of the high speed cable is less than a transmission loss of the cabling 15) is used to directly connect the chip 14 to the backplane connector 12, a transmission loss of the electrical signal can be reduced. Based on this, to secure the high speed cable to the board to implement communication between the chip 14 and the backplane 13, as shown in FIG. 2, a transition connector 21 may be added on the board 11, and cable connectors 23 are added on two ends of the high speed cable 22. A cable connector 23 on one end is connected to the chip 14, and the cable connector 23 on the other end is connected to the transition connector 21. The transition connector 21 imports a received high speed electrical signal to the cabling 15 inside the board 11. The electrical signal finally reaches the backplane 13 by using the backplane connector 12.

That is, in a connection structure shown in FIG. 2, the electrical signal sent by the chip 14 to the backplane 13 is first transmitted on the high speed cable 22, then is guided by the transition connector 21, and is transmitted to the backplane 13 on the cabling 15 inside the board 11. A transmission loss of the electrical signal can be reduced when the electrical signal is transmitted on the high speed cable 22. However, because the transition connector 21 is added inside the board 11, a crosstalk phenomenon may occur when the electrical signal is transmitted on neighboring signal lines inside the transition connector 21. In addition, because a part of a transmission path of the electrical signal is on the cabling 15, a transmission loss resulted from the cabling 15 cannot be reduced.

SUMMARY

Embodiments of the present disclosure provide a connector and a communications device, to eliminate a crosstalk phenomenon resulted from addition of a transition connector and reduce a transmission loss of an electrical signal in a transmission process.

The following technical solutions are used in the embodiments of the present disclosure to achieve the foregoing objectives.

According to a first aspect, an embodiment of the present disclosure provides a connector, including a connector body and three connecting ends disposed on the connector body, where M (M≥1) signal interfaces inside a first connecting end are in communication with M signal interfaces inside a second connecting end in a one-to-one correspondence, the first connecting end is connected to a backplane connector on a backplane, the second connecting end is connected to one end of a transmission cable, the other end of the transmission cable is connected to a communications component on a target board, the backplane is configured to implement communication between X boards, and the target board is any one of X (X≥1) boards; and a third connecting end is configured to secure the connector body to the target board. In this way, an electrical signal sent by the communications component on the target board may be directly transmitted to the backplane by using the transmission cable and the connector without passing through a cabling disposed inside the target board, and a transmission loss of the transmission cable is usually less than a transmission loss of the cabling inside the target board. Therefore, a transmission loss of the electrical signal in a transmission process can be reduced.

In addition, the electrical signal on the transmission cable is directly transmitted to the backplane by using the connector, and the electrical signal does not need to be guided from the transmission cable to the cabling inside the target board by using a transition connector. Therefore, additional crosstalk that occurs because the electrical signal is guided to the cabling inside the board by using the transition connector compared with other approaches also can be avoided.

In one embodiment, the signal interface may be a pin-shaped signal interface, a connecting finger-shaped conductive contact, or a ball grid array package-shaped signal interface.

In one embodiment, inside the connector body, M signal pins are disposed throughout the first connecting end and the second connecting end, and two ends of each signal pin are respectively used as a signal interface inside the first connecting end and a signal interface inside the second connecting end.

In one embodiment, a package substrate is disposed inside the connector body, M conducting wires are disposed inside the package substrate, one end of each conducting wire is connected to one signal interface inside the first connecting end, and the other end of the conducting wire is connected to one signal interface inside the second connecting end.

In one embodiment, a grounding pin is disposed inside each of the first connecting end, the second connecting end, and the third connecting end, where the grounding pin of the first connecting end is in communication with the grounding pin of the third connecting end; and the grounding pin of the second connecting end is in communication with the grounding pin of the third connecting end, so that the electrical signal forms a complete loop in the transmission process. In addition, after the grounding pin of the first connecting end and the grounding pin of the second connecting end are grounded, a unified reference plane may be provided for the electrical signal, so that the electrical signal maintains a consistent and continuous impedance in the transmission process.

In one embodiment, the grounding pin of the third connecting end is secured to the target board through a crimped connection, or the grounding pin of the third connecting end is secured to the target board through a welded connection.

In one embodiment, a first cable head and a second cable head are respectively disposed on two ends of the transmission cable, where the transmission cable is connected to the second connecting end by using the first cable head, and the transmission cable is connected to the communications component by using the second cable head.

In one embodiment, the M signal interfaces inside the second connecting end constitute N input ends, and each input end includes at least one signal interface, where N≥1, N communications components are disposed on the target board, and each communications component is connected to an input end by using a transmission cable. In this way, each input end may be connected to a communications component on the target board by using the transmission cable. In this case, the N communications components on the target board all may directly transmit the electrical signal to the backplane by using the connector, thereby greatly reducing the transmission loss of the electrical signal in the transmission process.

In one embodiment, the connector body is a housing supporting and/or securing the three connecting ends.

In one embodiment, a PCB circuit is disposed on the target board, and the PCB circuit is configured to complete a preset communication function.

According to a second aspect, an embodiment of the present disclosure provides a communications device, including a backplane and X boards connected to the backplane, where a communications component is disposed on a target board, the communications component is connected to the backplane by using any one of the foregoing connectors, and the target board is any one of the X boards.

In one embodiment, a first connecting end of the connector is connected to a backplane connector of the backplane; a second connecting end of the connector is connected to one end of a transmission cable, and the other end of the transmission cable is connected to the communications component; and a third connecting end of the connector is connected to the target board.

In one embodiment, the third connecting end of the connector is connected to the target board by using a daughter board, and the daughter board is a subboard of the target board and is configured to implement at least one communication function of the target board. In this way, the target board may implement different functions by disposing different daughter boards.

In one embodiment, the communications component may be at least one of a chip, a processor, and a memory.

In the present disclosure, a name of the connector or the communications device does not constitute a limitation on the device itself. During actual implementation, these devices may have other names, provided that functions of the devices are similar to those in the present disclosure and fall within the scope defined by the following claims and equivalent technologies of the present disclosure.

These aspects or other aspects of the present disclosure are more concise and understandable in the description of the following embodiments.

DESCRIPTION OF EMBODIMENTS

The following describes the technical solutions in the embodiments of the present disclosure in detail with reference to the accompanying drawings in the embodiments of the present disclosure. Apparently, the described embodiments are merely some but not all of the embodiments of the present disclosure.

In addition, the terms "first" and "second" are merely intended for a purpose of description, and shall not be understood as an indication or implication of relative importance or implicit indication of a quantity of indicated technical features. Therefore, a feature restricted by "first" or "second" may explicitly indicate or implicitly include one or more such features. In the descriptions in the present disclosure, unless otherwise provided, "a plurality of" means two or more than two.

Figure 1:
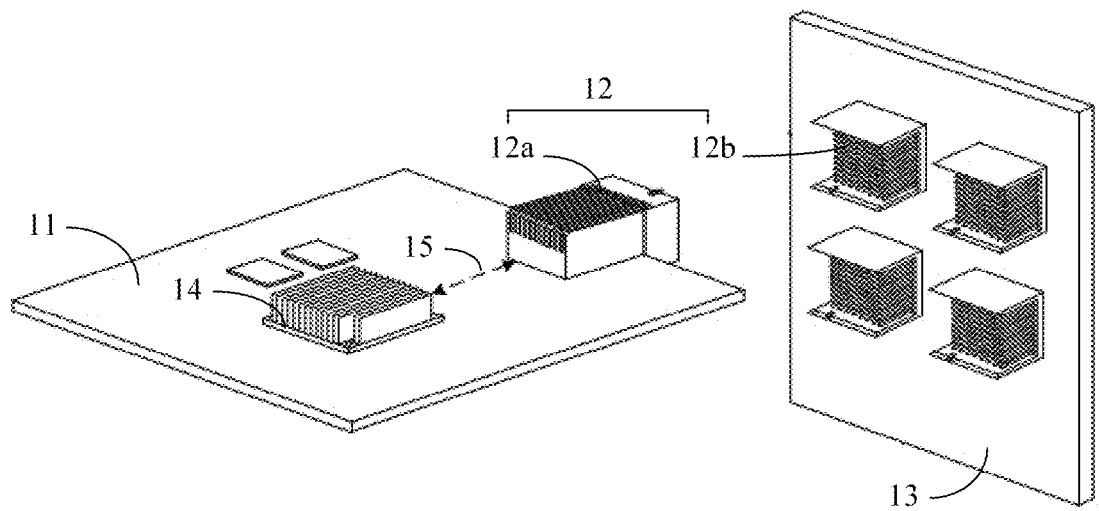
FIG. 1 is a schematic diagram 1 of a connection structure of a board and a backplane in the prior art.
Figure 2:
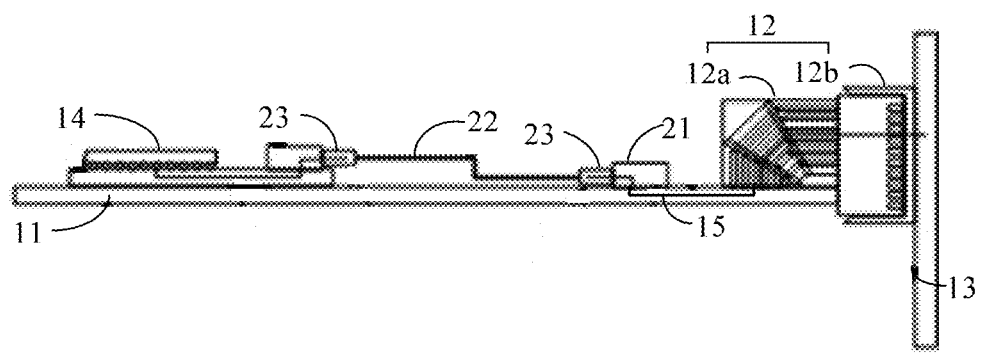
FIG. 2 is a schematic diagram 2 of a connection structure of a board and a backplane in the prior art.
Figure 3:
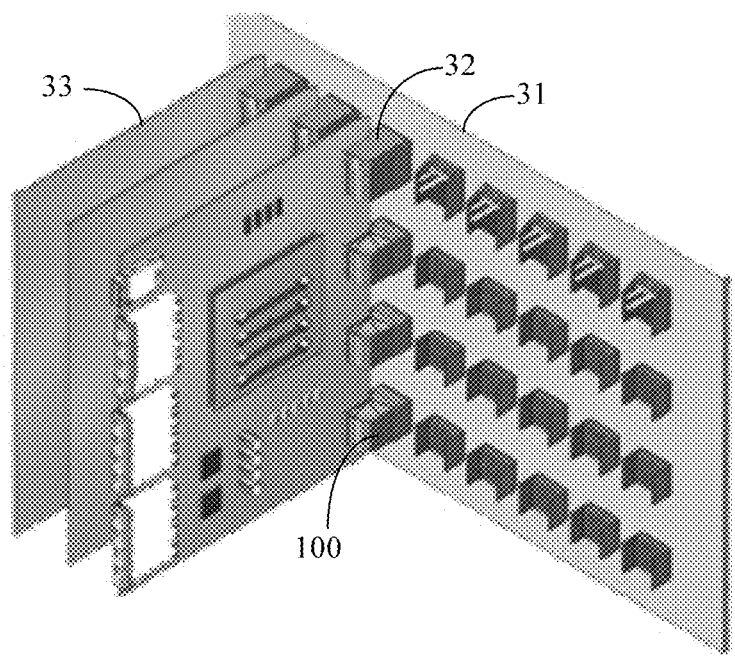
FIG. 3 is a schematic diagram of an internal structure of a communications device according to an embodiment of the present disclosure.

An embodiment of the present disclosure provides a connector, which may be applied to any communications device whose X (X≥1) boards need to be connected by using a backplane for communication. FIG. 3 is a schematic diagram of a possible internal structure of the communications device. A plurality of backplane connectors 32 that are arranged in an array are disposed on a backplane 31. Different boards 33 may be connected to corresponding backplane connectors 32 by using a connector 100 provided in this embodiment of the present disclosure, so that the different boards 33 are inserted on the backplane 31. In this case, communications components (for example, a chip) on the different boards 33 can implement communication by using the backplane 31.

Based on the schematic diagram of the internal structure of the communications device shown in FIG. 3, the following describes the connector 100 provided in this embodiment of the present disclosure in detail by using a connection manner of a target board and the backplane 31 as an example.

The target board is any one of the X boards 33. A printed circuit board (PCB) circuit is disposed on the target board. The PCB circuit may be configured to complete a preset communication function, for example, packet parsing, data sending, and data receiving. This is not limited in this embodiment of the present disclosure.

Figure 4:
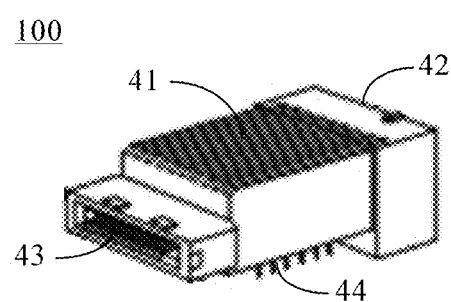
FIG. 4 is a schematic structural diagram 1 of a connector according to an embodiment of the present disclosure.

Further, as shown in FIG. 4, the connector 100 includes a connector body 41 and three connecting ends disposed on the connector body 41 (that is, a first connecting end 42, a second connecting end 43, and a third connecting end 44). The connector body 41 is a housing supporting and/or securing the three connecting ends.

Figure 5:
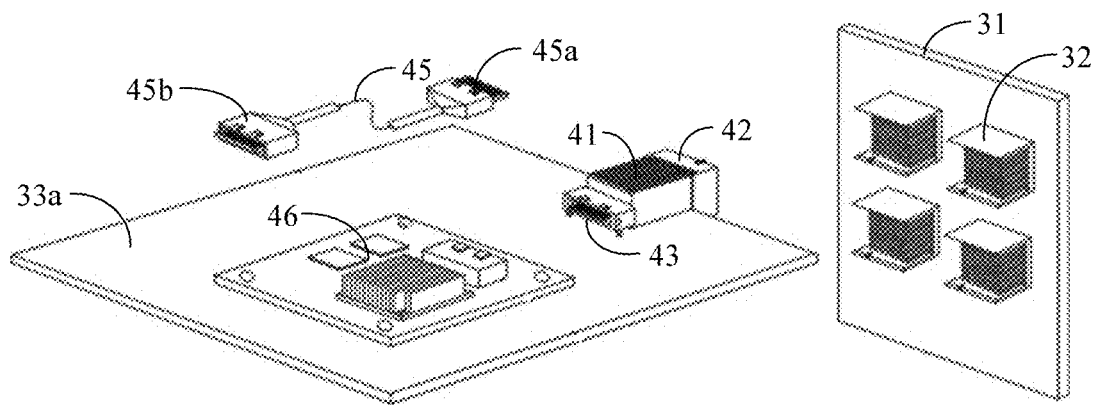
FIG. 5 is a schematic diagram 1 of a connection structure of a target board and a backplane according to an embodiment of the present disclosure.

As shown in FIG. 5, the first connecting end 42 is connected to the backplane connector 32 on the backplane 31; the second connecting end 43 is connected to one end of the transmission cable 45 (that is, 45a shown in FIG. 5), and the other end of the transmission cable 45 (that is, 45b shown in FIG. 5) is connected to a communications component 46 on a target board 33a; and the third connecting end 44 (not shown in FIG. 5) is configured to secure the connector body 41 to the target board 33a.

Figure 6:
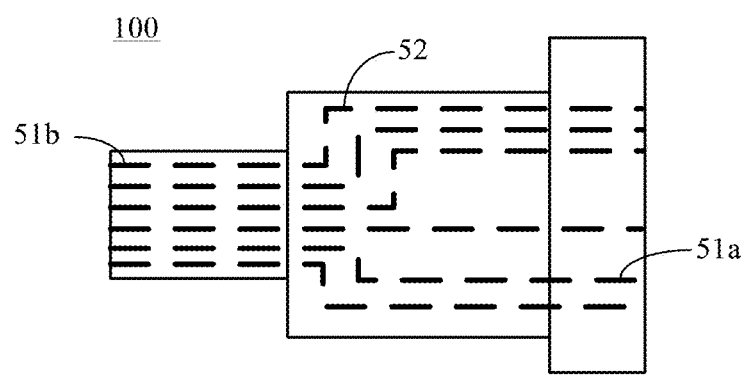
FIG. 6 is a schematic diagram 1 of an internal structure of a connector according to an embodiment of the present disclosure.

As shown in FIG. 6, M signal interfaces 51a inside the first connecting end 42 are in communication with M signal interfaces 51b inside the second connecting end 43 in a one-to-one correspondence, where M≥1.

In this way, after an electrical signal sent by the communications component 46 passes through the transmission cable 45, the electrical signal may be directly transmitted from a signal interface 51b inside the second connecting end 43 to a signal interface 51a inside the first connecting end 42, and then is transmitted to the backplane 31 by using the backplane connector 32. That is, the electrical signal sent by the communications component 46 on the target board 33a may be directly transmitted to the backplane 31 by using the transmission cable 45 and the connector 100 without passing through a cabling disposed inside the target board 33a. A transmission loss of the transmission cable 45 is usually less than a transmission loss of the cabling inside the target board 33a. Therefore, a transmission loss of the electrical signal in a transmission process can be reduced. In addition, the electrical signal on the transmission cable 45 is directly transmitted to the backplane 31 by using the connector 100, and the electrical signal does not need to be guided from the transmission cable 45 to the cabling inside the target board 33a by using a transition connector. Therefore, additional crosstalk that occurs because the electrical signal is guided to the cabling inside the board by using the transition connector compared with other approaches also can be avoided.

It should be noted that the signal interface 51a inside the first connecting end 42 and the signal interface 51b inside the second connecting end 43 may also be referred to as a pin, and an appearance thereof may have various shapes. For example, the signal interface 51a and signal interface 51b may be further a pin-shaped signal interface, or may be a connecting finger-shaped conductive contact, or may be a ball grid array (BGA)-shaped signal interface. This is not limited in this embodiment of the present disclosure.

For example, the signal interface 51a and signal interface 51b are pin-shaped signal interfaces. Still as shown in FIG. 6, inside the connector body 41, M signal pins 52 are disposed throughout the first connecting end 42 and the second connecting end 43, and two ends of each signal pin 52 are respectively used as a signal interface 51a inside the first connecting end 42 and a signal interface 51b inside the second connecting end 43. In this way, after receiving the electrical signal from the communications component 46, the signal interface 51a may directly transmit the electrical signal to signal interface 51b by using the signal pin 52, and then signal interface 51b transmits the electrical signal to the backplane connector 32 on the backplane 31.

Certainly, a package substrate similar to the PCB may alternatively be disposed inside the connector body 41. In this case, M conducting wires may be disposed inside the package substrate. One end of each conducting wire is connected to one signal interface 51a inside the first connecting end 42, and the other end of the conducting wire may be connected to one signal interface 51b inside the second connecting end 43, so that the M signal interfaces 51a inside the first connecting end 42 are in communication with the M signal interfaces 51b inside the second connecting end 43 in a one-to-one correspondence. This is not limited in this embodiment of the present disclosure.

In addition, it should be noted that in addition to the M signal interfaces 51a, the first connecting end 42 may further include another signal interface. Similarly, in addition to the M signal interfaces 51b, the second connecting end 43 may further include another signal interface. In this case, when a quantity of signal interfaces inside the first connecting end 42 is inconsistent with a quantity of signal interfaces inside the second connecting end 43, some signal interfaces may be idle. For example, 10*10 signal interfaces 51a are disposed inside the first connecting end 42, and 8*8 signal interfaces 51b are disposed inside the second connecting end 43. In this case, 8*8 signal interfaces 51a inside the first connecting end 42 are in communication with the 8*8 signal interfaces 51b inside the second connecting end 43 in a one-to-one correspondence, and remaining 36 (10*10−8*8) signal interfaces 51a inside the first connecting end 42 are idle.

Figure 7:
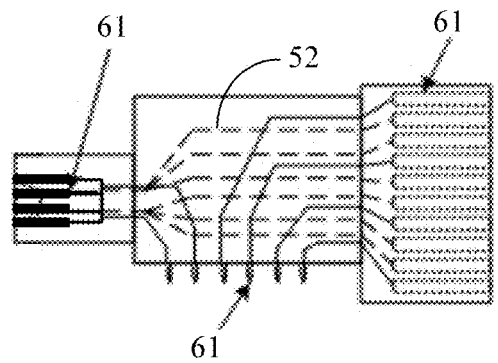
FIG. 7 is a schematic diagram 2 of an internal structure of a connector according to an embodiment of the present disclosure.

Further, as shown in FIG. 7, a grounding pin 61 may be disposed inside each of the first connecting end 42, the second connecting end 43, and the third connecting end 44. The grounding pin of the first connecting end 42 may be in communication with the grounding pin 61 of the third connecting end 44 by using a grounding pin; and the grounding pin 61 of the second connecting end 43 may also be in communication with the grounding pin 61 of the third connecting end 44 by using a grounding pin.

The grounding pin 61 inside the first connecting end 42 and the grounding pin 61 inside the second connecting end 43 are separately in communication with the grounding pin 61 of the third connecting end 44, so that the electrical signal may form a complete loop in the transmission process. In addition, after the grounding pin 61 inside the first connecting end 42 and the grounding pin 61 inside the second connecting end 43 are grounded, a unified reference plane may be provided for the electrical signal, so that the electrical signal maintains a consistent and continuous impedance in the transmission process, thereby increasing signal integrity (SI) of the electrical signal in the transmission process, and reducing electromagnetic interference (EMI) of the electrical signal in the transmission process.

It should be noted that a grounding pin 61 inside the first connecting end 42 and a grounding pin 61 inside the second connecting end 43 are used as an example, the grounding pin inside the first connecting end 42 and the grounding pin inside the second connecting end 43 may be connected to different grounding pins inside the third connecting end 44, or may be connected to a same grounding pin inside the third connecting end 44. This is not limited in this embodiment of the present disclosure.

Further, the grounding pin 61 of the third connecting end 44 may be secured to the target board 33a through a crimped connection, or may be secured to the target board 33a through a welded connection. This is not limited in this embodiment of the present disclosure.

In addition, the transmission cable 45 may be further high-speed cables of various types, such as quad small form-factor pluggable (QSFP), quad small form-factor pluggable plus (QSFP+), extended capacity form-factor pluggable (CXP), and serial attached SCSI (SAS). This is not limited in this embodiment of the present disclosure.

Figure 8:
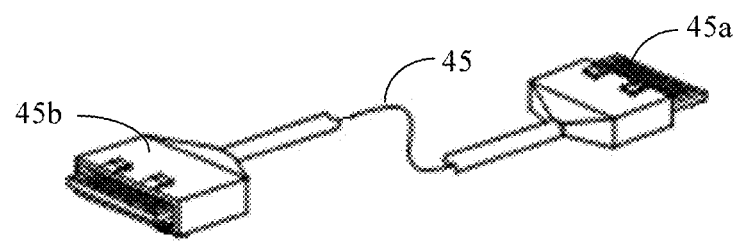
FIG. 8 is a schematic structural diagram of a transmission cable according to an embodiment of the present disclosure.

Further, as shown in FIG. 8, a first cable head 45a and a second cable head 45b are respectively disposed on two ends of the transmission cable 45. In this way, still as shown in FIG. 5, the transmission cable 45 may be connected to the second connecting end 43 by using the first cable head 45a, and may be connected to the communications component 46 by using the second cable head 45b.

For example, the first cable head 45a and the second cable head 45b may be further connecting finger connectors. This is not limited in this embodiment of the present disclosure.

Figure 9:
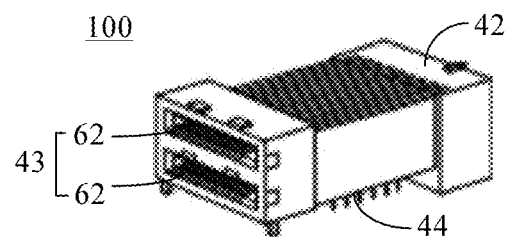
FIG. 9 is a schematic structural diagram 2 of a connector according to an embodiment of the present disclosure.

Further, as shown in FIG. 9, the M signal interfaces 51b inside the second connecting end 43 may constitute N (N≥1) input ends 62 (each input end 62 includes at least one signal interface 51b). In this way, each input end 62 may be connected to a communications component 46 on the target board 33a by using a transmission cable 45. In this case, the N communications components 46 on the target board 33a all can directly transmit the electrical signal to the backplane 31 by using the connector 100, thereby greatly reducing the transmission loss of the electrical signal in the transmission process.

Based on any one of the connectors 100 shown in the foregoing embodiments, an embodiment of the present disclosure further provides a communications device. The communications device includes a backplane and X boards connected to the backplane. A communications component is disposed on a target board (the target board is any one of the X boards). The communications component is connected to the backplane by using any one of the foregoing connectors 100.

FIG. 5 is still used as an example, and is a schematic diagram of a connection structure between a target board 33a and a backplane 31 inside the communications device. A first connecting end 42 of the connector 100 is connected to a backplane connector 32 on a backplane 31, a second connecting end 43 of the connector 100 is connected to one end of a transmission cable 45, the other end of the transmission cable 45 is connected to the communications component 46 on the target board 33a, and a third connecting end 43 of the connector 100 is configured to secure a connector body 41 to the target board 33a.

A signal interface 51a inside the first connecting end 42 connected to the backplane connector 32 may be in a curved female form when a pin inside the backplane connector 32 is in a straight male form. The signal interface 51a inside the first connecting end 42 connected to the backplane connector 32 may be in a straight male form when the pin inside the backplane connector 32 is in a curved female form.

In addition, M signal interfaces 51a inside the first connecting end 42 are in communication with M signal interfaces 51b inside the second connecting end 43 in a one-to-one correspondence, where M≥1.

In this way, the communications component 46 may transmit, to the transmission cable 45 by using a directly extended high speed interface, an electrical signal needing to be transmitted, and then the transmission cable 45 directly transmits the electrical signal to the backplane connector 32 by using the connector 100 to reach the backplane 31, thereby reducing a transmission loss and crosstalk of the electrical signal in a transmission process.

Figure 10:
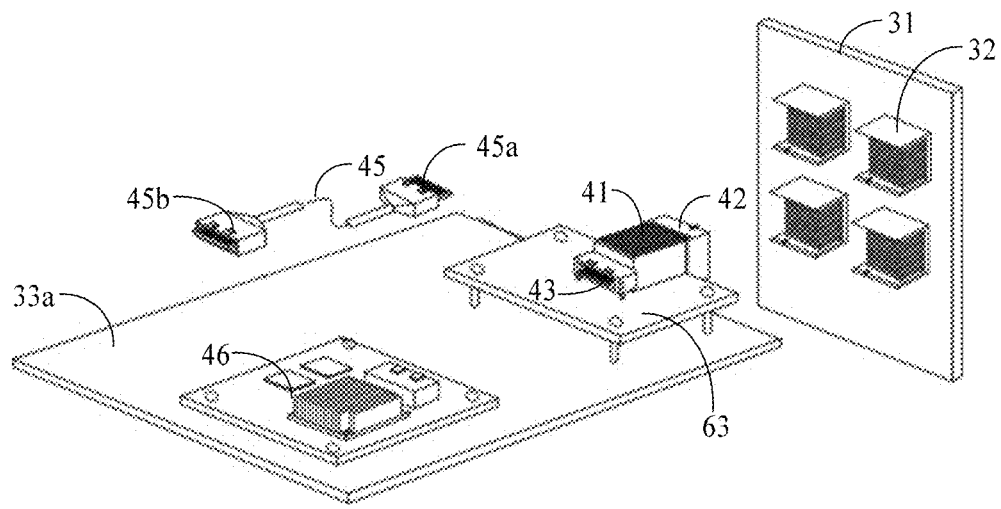
FIG. 10 is a schematic diagram 2 of a connection structure of a target board and a backplane according to an embodiment of the present disclosure.

Further, as shown in FIG. 10, when a daughter board 63 (the daughter board 63 is a subboard of a target board 33a, and may be configured to implement at least one function of the target board 33a) is disposed on the target board 33a. The foregoing third connecting end 44 may be disposed on the daughter board 63, that is, connected to the target board 33a by using the daughter board 63. A first connecting end 42 is still connected to a backplane connector 32 on a backplane 31, and a second connecting end 43 is still connected to a transmission cable 45.

In this way, the target board 33a may implement different communication functions by disposing different daughter boards 63. In addition, compared with the target board 33a, as an field replaceable unit (FRU), the daughter board 63 is more flexible and is more easily deployed, and maintenance costs are lower.

In addition, the communications component may be a chip, a processor, or a functional module having a particular function. The processor may be a central processing unit (CPU), a general-purpose processor, a digital signal processor (DSP), an application-specific integrated circuit (ASIC), a field programmable gate array (FPGA) or another programmable logic device, a transistor logic device, a hardware component, or any combination thereof. The processor may implement or execute various examples of logical blocks, modules, and circuits that are described with reference to the contents disclosed in the present disclosure. The processor may also be a combination of computing functions, for example, includes a combination of one or more microprocessors or a combination of a digital signal processor (DSP) and a microprocessor. This is not limited in this embodiment of the present disclosure.

It should be noted that the communication function implemented by the target board 33a or the daughter board 63 in the foregoing embodiment may be implemented by a processor executing a corresponding software instruction. The software instruction may include a corresponding software module. The software module may be stored in a random access memory (RAM), a flash memory, a read-only memory (ROM), an erasable programmable read-only memory (EPROM), an electrically erasable programmable read-only memory (EEPROM), a register, a hard disk, a removable hard disk, a compact disc read-only memory (CD-ROM), or a storage medium in any other forms well-known in the art. A storage medium used as an example is coupled to the processor, so that the processor can read information from the storage medium, and can write information into the storage medium. Certainly, the storage medium may be a part of the processor. This is not limited in this embodiment of the present disclosure.

A person of skill in the art should be aware that in one or more of the foregoing examples, the functions described in the present disclosure may be implemented by using hardware, software, firmware, or any combination thereof. These functions may be stored in a computer-readable medium or transmitted as one or more instructions or code in the computer-readable medium when this application is implemented by software. The computer-readable medium includes a computer storage medium and a communications medium, where the communications medium includes any medium that enables a computer program to be transmitted from one place to another. The storage medium may be any available medium accessible to a general or dedicated computer.

The objectives, technical solutions, and benefit effects of the present disclosure are further described in detail in the foregoing further embodiments. It should be understood that the foregoing descriptions are merely further embodiments of the present disclosure, but are not intended to limit the protection scope of the present disclosure. Any modification, equivalent replacement, or improvement made based on the technical solutions of the present disclosure shall fall within the protection scope of the present disclosure.

What is claimed is:

1. A connector, comprising a connector body and three connecting ends disposed on the connector body, wherein
M signal interfaces inside a first connecting end are in communication with M signal interfaces inside a second connecting end in a one-to-one correspondence, the first connecting end is connected to a backplane connector on a backplane, the second connecting end is connected to one end of a transmission cable, the other end of the transmission cable is connected to a communications component on a target board, and the backplane is configured to implement communication between X boards, wherein the target board is any one of the X boards, M≥1, and X≥1; and
a third connecting end is configured to secure the connector body to the target board.

2. The connector according to claim 1, wherein inside the connector body, M signal pins are disposed throughout the first connecting end and the second connecting end, and two ends of each signal pin are respectively used as a signal interface inside the first connecting end and a signal interface inside the second connecting end.

3. The connector according to claim 1, wherein a grounding pin is disposed inside each of the first connecting end, the second connecting end, and the third connecting end, wherein
the grounding pin of the first connecting end is in communication with the grounding pin of the third connecting end; and
the grounding pin of the second connecting end is in communication with the grounding pin of the third connecting end.

4. The connector according to claim 3, wherein the grounding pin of the third connecting end is secured to the target board through a crimped connection, or the grounding pin of the third connecting end is secured to the target board through a welded connection.

5. The connector according to claim 1, wherein a first cable head and a second cable head are respectively disposed on two ends of the transmission cable, wherein
the transmission cable is connected to the second connecting end by using the first cable head, and the transmission cable is connected to the communications component by using the second cable head.

6. The connector according to claim 1, wherein the M signal interfaces inside the second connecting end constitute N input ends, and each input end comprises at least one signal interface, wherein N≥1, wherein
N communications components are disposed on the target board, and each communications component is connected to an input end by using a transmission cable.

7. The connector according to claim 1, wherein the connector body is a housing supporting and/or securing the three connecting ends.

8. The connector according to claim 1, wherein a printed circuit board (PCB) circuit is disposed on the target board, and the PCB circuit is configured to complete a preset communication function.

9. A communications device, comprising a backplane and X boards connected to the backplane, wherein a communications component is disposed on a target board, the communications component is connected to the backplane by using a connector, and the target board is any one of the X boards, wherein the connector comprises a connector body and three connecting ends disposed on the connector body, wherein
M signal interfaces inside a first connecting end are in communication with M signal interfaces inside a second connecting end in a one-to-one correspondence, the first connecting end is connected to a backplane connector on the backplane, the second connecting end is connected to one end of a transmission cable, the other end of the transmission cable is connected to the communications component on the target board, and the backplane is configured to implement communication between the X boards, wherein the target board is any one of the X boards, M≥1, and X≥1; and
a third connecting end is configured to secure the connector body to the target board.

10. The communications device according to claim 9, wherein inside the connector body, M signal pins are disposed throughout the first connecting end and the second connecting end, and two ends of each signal pin are respectively used as a signal interface inside the first connecting end and a signal interface inside the second connecting end.

11. The communications device according to claim 9, wherein a grounding pin is disposed inside each of the first connecting end, the second connecting end, and the third connecting end, wherein
the grounding pin of the first connecting end is in communication with the grounding pin of the third connecting end; and
the grounding pin of the second connecting end is in communication with the grounding pin of the third connecting end.

12. The communications device according to claim 9, wherein the grounding pin of the third connecting end is secured to the target board through a crimped connection, or the grounding pin of the third connecting end is secured to the target board through a welded connection.

13. The communications device according to claim 9, wherein a first cable head and a second cable head are respectively disposed on two ends of the transmission cable, wherein
the transmission cable is connected to the second connecting end by using the first cable head, and the transmission cable is connected to the communications component by using the second cable head.

14. The communications device according to claim 9, wherein the M signal interfaces inside the second connecting end constitute N input ends, and each input end comprises at least one signal interface, wherein N≥1, wherein
N communications components are disposed on the target board, and each communications component is connected to an input end by using a transmission cable.

15. The communications device according to claim 9, wherein the connector body is a housing supporting and/or securing the three connecting ends.

16. The communications device according to claim 9, wherein a printed circuit board PCB circuit is disposed on the target board, and the PCB circuit is configured to complete a preset communication function.

17. The communications device according to claim 10, wherein a grounding pin is disposed inside each of the first connecting end, the second connecting end, and the third connecting end, wherein the grounding pin of the first connecting end is in communication with the grounding pin of the third connecting end; and the grounding pin of the second connecting end is in communication with the grounding pin of the third connecting end.

18. The communications device according to claim 9, wherein a first connecting end of the connector is connected to a backplane connector of the backplane;

a second connecting end of the connector is connected to one end of a transmission cable, and the other end of the transmission cable is connected to the communications component; and a third connecting end of the connector is connected to the target board.

19. The communications device according to claim 9, wherein the third connecting end of the connector is connected to the target board by using a daughter board, and the daughter board is a subboard of the target board and is configured to implement at least one function of the target board.

20. The communications device according to claim 18, wherein the third connecting end of the connector is connected to the target board by using a daughter board, and the daughter board is a subboard of the target board and is configured to implement at least one function of the target board.

* * * * *